(12) United States Patent
Yen et al.

(10) Patent No.: US 9,559,001 B2
(45) Date of Patent: Jan. 31, 2017

(54) CHIP PACKAGE AND METHOD FOR FORMING THE SAME

(75) Inventors: Yu-Lin Yen, Taipei (TW); Ming-Kun Yang, Pingzhen (TW); Tsang-Yu Liu, Zhubei (TW); Long-Sheng Yeou, Hsinchu (TW)

(73) Assignee: XINTEC INC., Taoyuan (TW)

( * ) Notice: Subject to any disclaimer, the term of this patent is extended or adjusted under 35 U.S.C. 154(b) by 1213 days.

(21) Appl. No.: 13/024,156

(22) Filed: Feb. 9, 2011

(65) Prior Publication Data

US 2011/0193241 A1    Aug. 11, 2011

Related U.S. Application Data

(60) Provisional application No. 61/302,848, filed on Feb. 9, 2010, provisional application No. 61/331,642, filed on May 5, 2010.

(51) Int. Cl.
| | | |
|---|---|---|
| H01L 23/48 | (2006.01) | |
| H01L 23/52 | (2006.01) | |
| H01L 29/40 | (2006.01) | |
| H01L 21/4763 | (2006.01) | |
| H01L 23/58 | (2006.01) | |

(Continued)

(52) U.S. Cl.
CPC ....... *H01L 21/76898* (2013.01); *H01L 23/481* (2013.01); *H01L 21/486* (2013.01); *H01L 21/76804* (2013.01); *H01L 21/76877* (2013.01); *H01L 23/49827* (2013.01); *H01L 24/05* (2013.01); *H01L 2224/0501* (2013.01); *H01L 2224/0557* (2013.01); *H01L 2924/0002* (2013.01); *H01L 2924/01078* (2013.01); *H01L 2924/01079* (2013.01); *H01L 2924/14* (2013.01); *H01L 2924/1461* (2013.01)

(58) Field of Classification Search
CPC .. H01L 21/76898; H01L 23/481; H01L 24/05; H01L 2924/14; H01L 2924/01078; H01L 2924/01079; H01L 2224/0557; H01L 21/486; H01L 21/76804; H01L 21/76877; H01L 23/49827; H01L 23/538; H01L 2224/0501; H01L 2924/0002; H01L 2924/1461; H01L 2924/00; H01L 2224/05552; G09B 19/02; H04L 12/185; H04L 12/189; H04L 12/581; H04L 12/5895; H04L 1/1867; H04L 51/04; H04W 4/08; H04W 56/001
USPC ............ 257/774, E21.585, E23.01; 370/336; 434/201; 438/643; 708/170; 709/206
See application file for complete search history.

(56) References Cited

U.S. PATENT DOCUMENTS 4,916,083 A * 4/1990 Monkowski et al. ........ 438/367
4,954,218 A * 9/1990 Okumura et al. ............ 438/439
(Continued)

FOREIGN PATENT DOCUMENTS

TW        200616055        5/2006

*Primary Examiner* — Teresa M Arroyo
(74) *Attorney, Agent, or Firm* — Liu & Liu

(57) ABSTRACT

According to an embodiment of the invention, a chip package is provided, which includes: a substrate having an upper surface and a lower surface; a hole extending from the upper surface toward the lower surface; an insulating layer located overlying a sidewall of the hole; and a material layer located overlying the sidewall of the hole, wherein the material layer is separated from the upper surface of the substrate by a distance and a thickness of the material layer decreases along a direction toward the lower surface.

21 Claims, 11 Drawing Sheets

(51) Int. Cl.
    *H01L 21/768*    (2006.01)
    *H01L 21/48*     (2006.01)
    *H01L 23/498*    (2006.01)
    *H01L 23/00*     (2006.01)

(56) References Cited

U.S. PATENT DOCUMENTS

| | | | |
|---|---|---|---|
| 5,036,376 A * | 7/1991 | Teherani et al. | 257/453 |
| 5,079,615 A * | 1/1992 | Yamazaki et al. | 257/534 |
| 5,565,708 A * | 10/1996 | Ohsaki et al. | 257/764 |
| 5,994,763 A * | 11/1999 | Ohmuro | 257/621 |
| 6,016,012 A * | 1/2000 | Chatila et al. | 257/775 |
| 6,483,162 B2 * | 11/2002 | Kwon et al. | 257/437 |
| 6,498,381 B2 * | 12/2002 | Halahan et al. | 257/449 |
| 6,844,627 B2 * | 1/2005 | Lee et al. | 257/751 |
| 7,449,784 B2 * | 11/2008 | Sherrer et al. | 257/774 |
| 7,670,955 B2 * | 3/2010 | Kameyama et al. | 438/700 |
| 7,750,478 B2 * | 7/2010 | Kameyama et al. | 257/774 |
| 7,880,307 B2 * | 2/2011 | Farnworth et al. | 257/774 |
| 8,564,101 B2 * | 10/2013 | Harada et al. | 257/621 |
| 2002/0047210 A1 * | 4/2002 | Yamada | H01L 21/76898 257/774 |
| 2002/0109000 A1 | 8/2002 | Rinne | |
| 2002/0167037 A1 * | 11/2002 | Lee | 257/301 |
| 2006/0087042 A1 * | 4/2006 | Kameyama et al. | 257/774 |
| 2006/0108695 A1 * | 5/2006 | Kameyama et al. | 257/774 |
| 2006/0121719 A1 | 6/2006 | Nakamura | |
| 2006/0202348 A1 * | 9/2006 | Kameyama et al. | 257/774 |
| 2006/0290001 A1 * | 12/2006 | Sulfridge | 257/774 |
| 2007/0184654 A1 * | 8/2007 | Akram | H01L 21/76898 438/675 |
| 2008/0048337 A1 * | 2/2008 | Takahashi et al. | 257/774 |
| 2009/0108464 A1 * | 4/2009 | Uchiyama | 257/774 |
| 2009/0194886 A1 | 8/2009 | Hiatt | |
| 2010/0127403 A1 * | 5/2010 | Muta | 257/774 |
| 2010/0314762 A1 * | 12/2010 | Schrank et al. | 257/741 |
| 2011/0193241 A1 | 8/2011 | Yen et al. | |
| 2011/0210451 A1 * | 9/2011 | Gambee | H01L 21/31133 257/774 |
| 2011/0260284 A1 * | 10/2011 | Schrank et al. | 257/506 |
| 2011/0278734 A1 | 11/2011 | Yen et al. | |
| 2011/0278735 A1 | 11/2011 | Yen et al. | |
| 2011/0285032 A1 | 11/2011 | Yen et al. | |
| 2012/0119384 A1 * | 5/2012 | Takii et al. | 257/774 |
| 2013/0015504 A1 * | 1/2013 | Kuo et al. | 257/213 |
| 2013/0221539 A1 * | 8/2013 | Kraft et al. | 257/774 |
| 2014/0159249 A1 * | 6/2014 | Uzoh | 257/774 |

* cited by examiner

CHIP PACKAGE AND METHOD FOR FORMING THE SAME

CROSS REFERENCE TO RELATED APPLICATIONS

This Application claims the benefit of U.S. Provisional Application No. 61/302,848, filed on Feb. 9, 2010, the entirety of which is incorporated by reference herein. This Application claims the benefit of U.S. Provisional Application No. 61/331,642, filed on May 5, 2010, the entirety of which is incorporated by reference herein.

BACKGROUND OF THE INVENTION

Field of the Invention

The present invention relates to a chip package and formation method thereof, and in particular relates to a chip package having a through substrate hole and formation method thereof.

Description of the Related Art

Recently, conducting structures (such as TSVs) perpendicular to a surface of a package substrate are commonly being formed in chip packages to form a conducting path along a vertical direction. As a result, space may be employed more effectively, such that the size of the chip package is further shrunk, which helps to improve performance of the chip package.

Typically, a conducting layer is formed on a sidewall of a hole perpendicular to a surface of a package substrate. However, the formed conducting layer may suffer from problems such as cracking or high stress at a bottom corner in the hole, such that the performance of the chip package is affected. In addition, in the conventional chip packaging technique, a complex patterning process needs to be applied, such that a plurality of photoresist application processes, patterning processes, and photoresist stripping processes need to be performed, increasing fabrication cost and time.

In addition, the conducting structure perpendicular to the surface of the package substrate is typically formed in a through substrate hole. The through substrate hole may not only be filled with a conducting material, but many other material stacking layers may also be formed therein. However, during the deposition process of these material stacking layers, these layers are usually also formed on the surface of the substrate outside of the hole. Thus, a following patterning process (usually including an etching process) often needs to be performed to remove undesired material stacking layers on the surface of the substrate. Not only is fabrication cost and time increased, but also, due to the additional patterning process, the elements or structures already formed on the surface of the substrate are at risk of being damaged.

Therefore, a chip packaging technique capable of reducing or resolving the problems mentioned above is desired.

BRIEF SUMMARY OF THE INVENTION

According to an embodiment of the invention, a chip package is provided, which includes: a substrate having an upper surface and a lower surface; a hole extending from the upper surface toward the lower surface; an insulating layer located overlying a sidewall of the hole; and a material layer located overlying the sidewall of the hole, wherein the material layer is separated from the upper surface of the substrate by a distance and a thickness of the material layer decreases along a direction toward the lower surface.

According to an embodiment of the invention, a method for forming a chip package is provided, which includes: providing a substrate having an upper surface and a lower surface; removing a portion of the substrate to form a hole in the substrate, wherein the hole extends from the upper surface towards the lower surface of the substrate; forming an insulating layer on a sidewall of the hole; and performing a deposition process to form a material layer on the sidewall of the hole, wherein the material layer is separated from the upper surface of the substrate by a distance, and a thickness of the material layer decreases along a direction towards the lower surface.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

The chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power IC chips.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits.

Figure 4A:
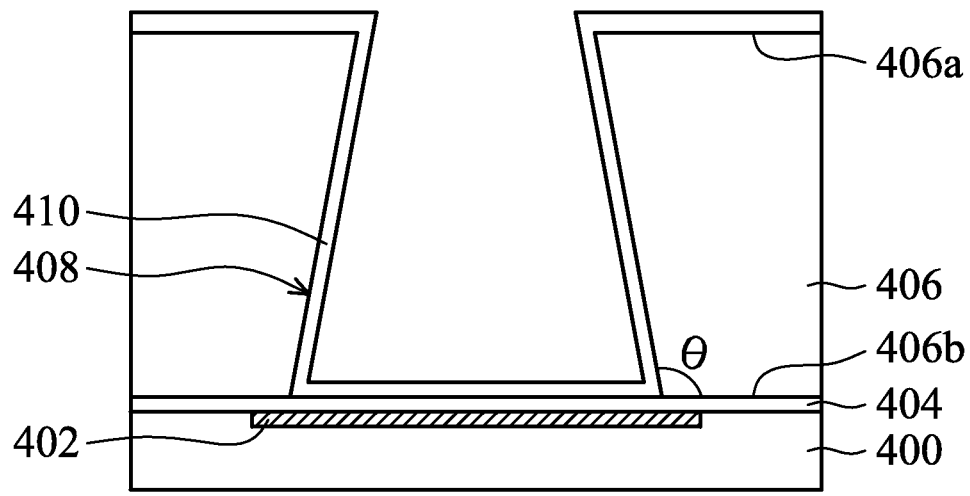
FIGS. 4A-4H are cross-sectional views showing the steps of forming a chip package according to an embodiment of the present invention.

FIGS. 4A-4H are cross-sectional views showing the steps of forming a chip package according to an embodiment of the present invention. As shown in FIG. 4A, a substrate 406 is provided, which includes an upper surface 406a and a lower surface 406b. A material of the substrate 406 may include, for example, (but is not limited to) a semiconductor material, ceramic material, or polymer material. In one embodiment, the substrate 406 is a silicon substrate. In another embodiment, the substrate 406 is a silicon wafer, and it is preferable to simultaneously form a plurality of chip packages by using a wafer-level packaging process along with a dicing process.

As shown in FIG. 4A, the chip package may include a conducting pad 402. For example, the conducting pad 402 may be electrically connected to another conducting wire and/or a chip (not shown). In one embodiment, the conducting pad 402 is located on the lower surface 406b of the substrate 406. In another embodiment, the conducting pad 402 may be located in the substrate 406. In the embodiment shown in FIG. 4A, the conducting pad 402 is located on the dielectric layer 404 on the lower surface 406b of the substrate 406. In one embodiment, a covering layer 400 is further included to cover the conducting pad 402 and the dielectric layer 404. The covering layer 400 is, for example, (but is not limited to) an insulating layer.

In addition, although FIG. 4A merely shows a single-layered conducting pad 402, embodiments of the invention are not limited thereto. A plurality of conducting pads may be stacked and/or arranged on the substrate 406. For example, in one embodiment, the conducting pad structure 402 may be a plurality of stacked conducting pads, at least a conducting pad, or a conducting pad structure constructed by at least a conducting pad and at least an interconnection structure.

Next, as shown in FIG. 4A, a portion of the substrate 406 is removed to form a hole 408 in the substrate 406. The hole 408 extends from the upper surface 406a towards the lower surface 406b of the substrate 406. In one embodiment, a width of a lower opening of the hole 408 near the lower surface 406b is larger than a width of an upper opening of the hole 408 near the upper surface 406a, having an "inverted angle" structure. Thus, a sidewall of the hole 408 inclines towards the surface of the substrate 406. For example, in the embodiment shown in FIG. 4A, there is an angle θ between the sidewall of the hole 408 and the lower surface 406b of the substrate 406, wherein the angle θ is larger than 90° and less than 180°. For example, the angle θ may be larger than 90° and less than 92°. It should be appreciated that embodiments of the invention are not limited to have the "inverted angle" structure. In another embodiment, the width of the lower opening of the hole 408 near the lower surface 406b may be, for example, smaller than the width of the upper opening of the hole 408 near the upper surface 406a, depending on requirements.

Further, it should be appreciated that the hole 408 may include openings having rectangular, elliptic, or like shapes. In one embodiment, the hole 408 may be a trench.

The forming of the hole 408 includes removing the substrate 406 by a dry etching process. For example, the substrate may be first removed by a main etching process, followed by an over-etching process by changing factors of the etching process. For example, process factors of the etching process, such as power, pressure, and concentration of the etching reaction gas, may be tuned to obtain the hole having the "inverted angle" structure.

Next, as shown in FIG. 4A, an insulating layer 410 is formed on the sidewall and a bottom of the hole 408. A material of the insulating layer 410 may be, for example, an epoxy resin, solder mask material, or other suitable insulating material, such as inorganic materials including silicon oxide, silicon nitride, silicon oxynitride, metal oxide, or combinations thereof, or organic polymer materials including polyimide, butylcyclobutene (BCB, Dow Chemical Co.), parylene, polynaphthalenes, fluorocarbons, or acrylates and so on. The method for forming the insulating layer 410 may include a coating method, such as a spin coating, spray coating, or curtain coating method, or other suitable deposition methods, such as a liquid phase deposition, physical vapor deposition, chemical vapor deposition, low pressure chemical vapor deposition, plasma enhanced chemical vapor deposition, rapid thermal chemical vapor deposition, or atmospheric pressure vapor deposition method. In one embodiment, the substrate 406 is a silicon substrate and the insulating layer 410 may be a silicon oxide layer obtained by performing a thermal oxidation process to the silicon substrate. In this embodiment, the insulating layer 410 covers the conducting pad 402 and is further extended to overly the upper surface 406a of the substrate 406.

Figure 4B:
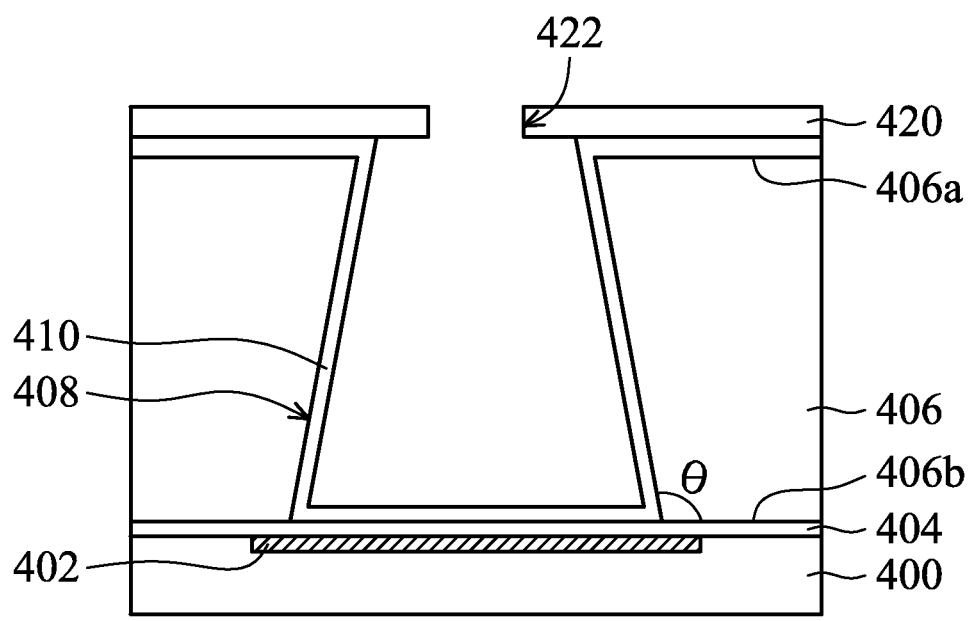

Next, as shown in FIG. 4B, a temporary blocking layer 420 is attached or disposed on the upper surface 406a of the substrate 406. The temporary blocking layer 420 has at least an opening exposing the hole 408. In one embodiment, the temporary blocking layer 420 preferably covers a portion of the hole 408. In this case, a portion of the temporary blocking layer 420 is suspended on the hole 408. A material of the temporary blocking layer 420 is preferably a material which can be removed easily. In one embodiment, the temporary blocking layer 420 is a photoresist material, such as a dry film. In one embodiment, a dry film may be attached on the substrate 406, and is then patterned to form a plurality of openings 422 in the temporary blocking layer 420. A width of the opening 422 may be smaller than a width of the upper opening of the hole 408 near the upper surface 406a. In another embodiment, before the temporary blocking layer 420 is attached or disposed on the substrate 406, the temporary blocking layer 420 is patterned according to the required opening pattern.

Figure 4C:
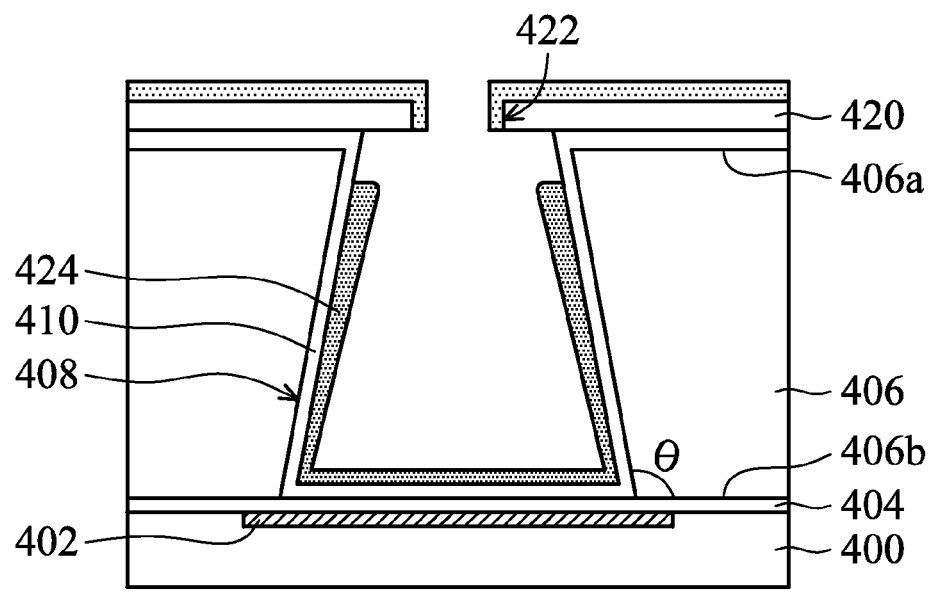

As shown in FIG. 4C, a deposition process is performed to at least a material layer 424 on the sidewall and the bottom of the hole 408. In one embodiment, when the material layer 424 is deposited in the hole 408, a portion of the material layer 424 will also be deposited on the temporary blocking layer 420. In the following process step, the temporary blocking layer 420 may be removed. Meanwhile, the material layer 424 formed on the temporary blocking layer 420 is also simultaneously removed to ensure the material layer 424 is only formed in the hole 408 without extending on the upper surface 406a of the substrate 406. In one embodiment, the formation method of the material layer 424 may include (but is not limited to) a physical vapor deposition, chemical vapor deposition, electroless plating, electroplating method, or combinations thereof.

In addition, in one embodiment, because of the blocking of the temporary blocking layer 420, there will be no material layer 424 formed on a portion of the sidewall of the hole 408 near the upper surface 406*a*, as shown in FIG. 4C. That is, the material layer 424 will be separated from the upper surface 406*a* of the substrate by a distance, such that a portion of the insulating layer 410 on the sidewall of the hole 408 is exposed. Thus, when the temporary blocking layer 420 is removed in the following process step, the material layer 424 will be maintained in the hole 408 without being removed with the temporary blocking layer 420 because the material layer 424 in the hole 408 is not connected with the material layer 424 deposited on the temporary blocking layer 420. In one embodiment, a thickness of the material layer 424 decreases along the sidewall of the hole 408 in a direction from top to bottom. For example, in FIG. 4C, the thickness of the material layer 424 near the upper surface 406*a* decreases along the sidewall of the hole 408 in a direction from the upper surface towards the bottom of the hole (or towards the lower surface 406*b*).

In one embodiment, the material layer 424 may be an insulating layer, and the material and formation method thereof may be similar to those of the insulating layer 410. When the material layer 424 is an insulating layer, it may be used to, for example, increase the thickness of the overall insulating layers on the sidewall of the hole 408, increase the adhesion between the material layer between a subsequently formed material layer on the sidewall of the hole 408, repair defects or voids possibly present in the insulating layer 410, or modify the surface profile of the insulating layer.

For example, in one embodiment, the material layer 424 may be a patterned photoresist layer which not only can modify the sidewall profile of the hole 408 to facilitate the deposition of a following material layer, but can also serve as a mask when an opening exposing the conducting pad 402 needs to be formed in a following process step.

In addition, although only a single-layered material layer 424 is shown in FIG. 4C, embodiments of the invention are not limited thereto. In another embodiment, the material layer 424 may be a multilayered structure. For example, a plurality of insulating layers may be repeatedly deposited on the insulating layer 410 by a similar method. When the material layer 424 is a multilayered structure, the materials and/or the thicknesses of each individual material layer may be completely different, completely the same, or partially the same.

Figure 4D:
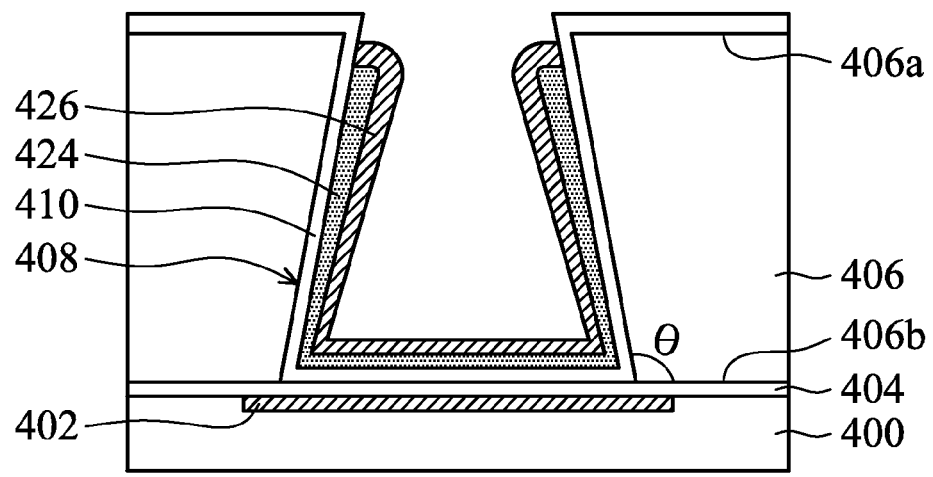

As shown in FIG. 4D, in one embodiment, a material layer 426 may be optionally formed in the hole by a similar method. In one embodiment, the previously formed temporary blocking layer 420 is kept and a deposition process is performed to form the material layer 426. Meanwhile, when the material layer 426 is deposited in the hole 408, a portion of the material layer 426 will also be deposited on the temporary blocking layer 420. After the material layer 426 is formed in the hole, the temporary blocking layer 420 may then be removed to form the structure shown in FIG. 4D. When the temporary blocking layer 420 is removed, the material layers 424 and 426 are removed together.

In addition, in another embodiment, the temporary blocking layer 420 may be first removed, followed by the forming of another temporary blocking layer (not shown) and the following process step of the material layer 426. It should be appreciated that different temporary blocking layers may have different opening patterns. Sizes, shapes, and distributions of the openings in the temporary blocking layers may be tuned according to requirements to correspondingly form the required material layer.

As shown in FIG. 4D, in one embodiment, because of the blocking of the temporary blocking layer, there will be no material layer 426 formed on a portion of the sidewall of the hole 408 near the upper surface 406*a*. That is, the material layer 426 will be separated from the upper surface 406*a* of the substrate by a distance, such that a portion of the insulating layer 410 on the sidewall of the hole 408 is exposed. In one embodiment, a thickness of the material layer 426 decreases along the sidewall of the hole 408 in a direction from top to bottom. For example, in FIG. 4D, the thickness of the material layer 426 near the upper surface 406*a* decreases along the sidewall of the hole 408 in a direction from the upper surface towards the bottom of the hole (or towards the lower surface 406*b*).

The material layer 426 may be another insulating layer. Alternatively, the material layer 426 may be a seed layer. When the material layer 426 is a seed layer, its material may be, for example, copper or a copper alloy, and its formation method may be, for example, a physical vapor deposition method. Further, the material layer 426 may also be a diffusion barrier layer which may be formed between a seed layer and the substrate 406. The material of the diffusion barrier layer may be, for example, a TiW or TiCu, which may prevent a subsequent, possibly deposited, seed layer or conducting layer (formed of copper, for example) from diffusion into the substrate 406 and improve the adhesion between the following possibly deposited, seed layer and the substrate 406. Similarly, the material layer 426 may also be a multilayered structure. For example, the material layer 426 may include a stacked layer of a seed layer and/or a diffusion barrier layer, wherein both the seed layer and/or the diffusion barrier layer may be a multilayered structure, respectively.

Figure 4E:
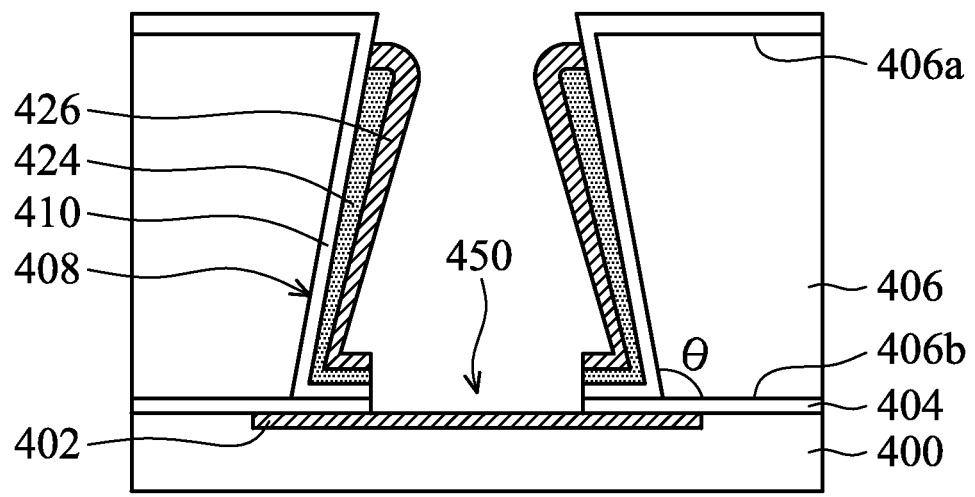
Figure 4F:
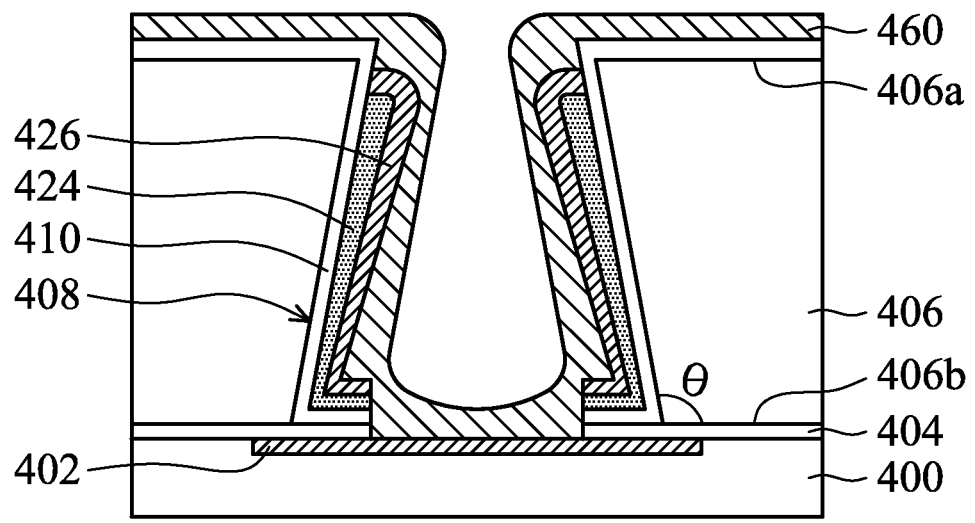

As shown in FIG. 4E, an etching process may be performed to the substrate 406 to form an opening 450 exposing the conducting pad 402. Then, as shown in FIG. 4F, a conducting layer 460 is formed in the hole. The conducting layer 460 is electrically connected to the conducting pad 402. In the embodiment shown in FIG. 4F, the conducting layer 460 is further extended on the upper surface 406*a* of the substrate 406. The conducting layer 460 may be used as a redistribution layer (RDL) and may be further electrically connected to a chip (not shown) disposed on the substrate 406. A material of the conducting layer 460 may include, for example, copper, aluminum, gold, platinum, or combinations thereof, and the formation method thereof may be, for example, a physical vapor deposition, chemical vapor deposition, electroplating, or electroless plating method.

Figure 4G:
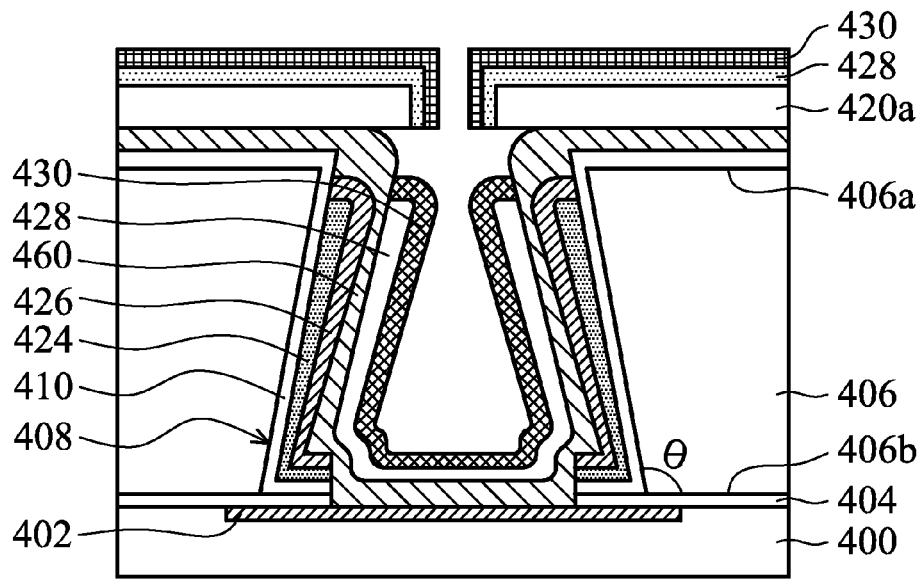

Next, as shown in FIG. 4G, a temporary blocking layer 420*a* may be optionally attached or disposed on the substrate 406. After the temporary blocking layer 420*a* is attached or disposed, a material layer 428 may be optionally formed in the hole 408 by a method similar to that used for forming the material layers 424 and 426.

As shown in FIG. 4G, in one embodiment, because of the blocking of the temporary blocking layer 420*a*, there will be no material layer 428 formed on a portion of the sidewall of the hole 408 near the upper surface 406*a*. That is, the material layer 428 will be separated from the upper surface 406*a* of the substrate by a distance, such that a portion of the conducting layer 460 on the sidewall of the hole 408 is exposed. In one embodiment, a thickness of the material layer 428 decreases along the sidewall of the hole 408 in a direction from top to bottom. For example, in FIG. 4G, the thickness of the material layer 428 near the upper surface 406a decreases along the sidewall of the hole 408 in a direction from the upper surface towards the bottom of the hole (or towards the lower surface 406b).

In one embodiment, the material layer 428 may be another conducting layer which may be used to, for example, increase the thickness of the overall conducting layer on the sidewall of the hole 408 to improve or tune the electrical characteristics, improve the adhesion between the material layer and a subsequently formed material layer, repair defects or voids possibly present in the conducting layer 460, or modify the surface profile of the conducting layer.

In addition, in one embodiment, as shown in FIG. 4G, a material layer 430 may be optionally formed in the hole. The material layer 430 may also be separated from the upper surface 406a of the substrate by a distance, such that a portion of the conducting layer 460 on the sidewall of the hole 408 is exposed. In one embodiment, a thickness of the material layer 430 decreases along the sidewall of the hole 408 in a direction from top to bottom. For example, in FIG. 4G, the thickness of the material layer 430 near the upper surface 406a decreases along the sidewall of the hole 408 in a direction from the upper surface 406a towards the bottom of the hole (or towards the lower surface 406b). In one embodiment, the material layer 430 may be another conducting layer. In another embodiment, the material layer 430 may be a buffer layer used for releasing stress of each material layer in the hole 408 to improve device reliability, wherein a material of the buffer layer may be, for example, a polymer material such as polyimide, soldermask, oxide, or dielectric, or combinations thereof. The buffer layer may be used to strengthen the structure and reliability of the package.

Figure 4H:
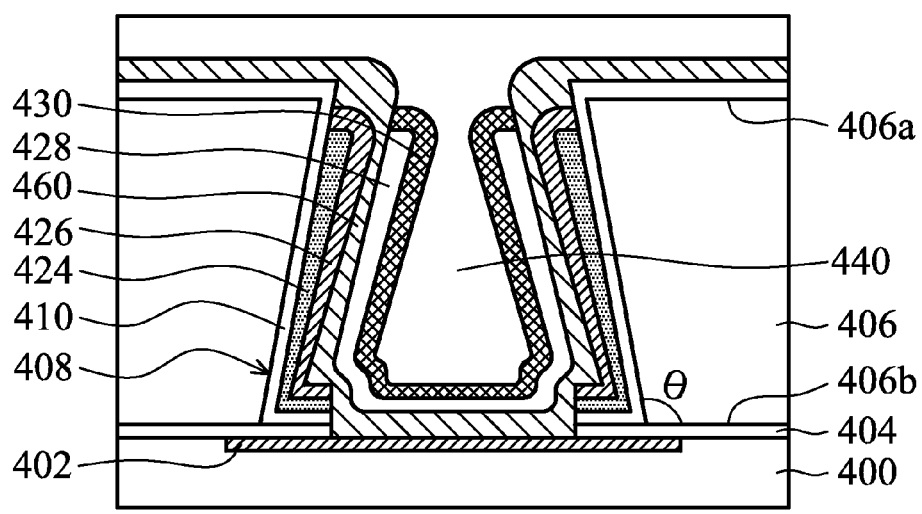

Next, as shown in FIG. 4H, the temporary blocking layer 420a is removed, and a filling layer 440 is optionally formed in the hole 408.

In the embodiments of the present invention, a temporary blocking layer is disposed on a substrate having a hole, such that a following deposited material layer is only formed in the hole without being formed on a surface of the substrate. A following patterning process is therefore not needed. The formed material layer is separated from the surface of the substrate by a distance without connecting with the temporary blocking layer. When the temporary blocking layer is subsequently removed, the material layer in the hole is not dragged out and peeled. By using the method mentioned in the embodiments of the present invention, a stacked layer of a variety of desired material layers may be formed only in the hole, which may include an insulating layer, photoresist layer, seed layer, diffusion barrier layer, conducting layer, and/or buffer layer. Fabrication cost of patterning processes may be reduced.

Although at least a temporary blocking layer is used in the embodiments mentioned above, embodiments of the invention are not limited thereto. In another embodiment, the temporary blocking layer is not used.

Figure 1A:
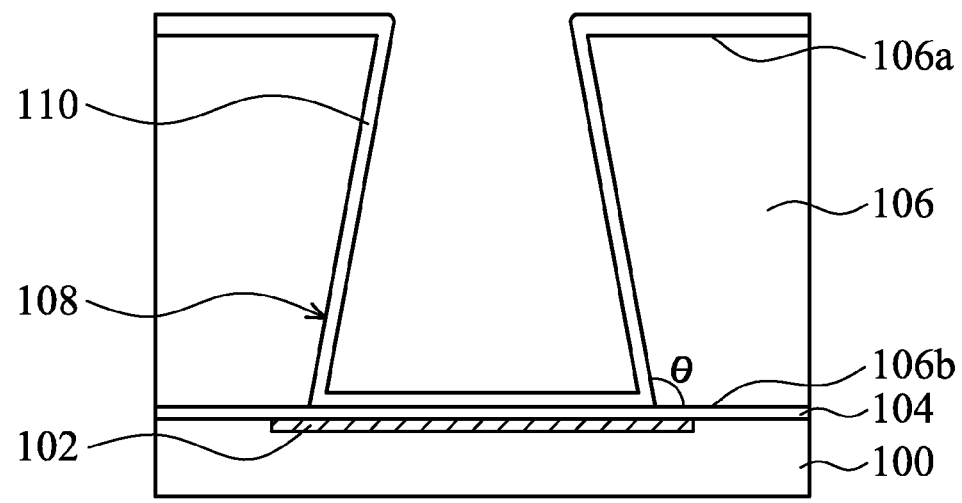
FIGS. 1A-1E are cross-sectional views showing the steps of forming a chip package according to an embodiment of the present invention.

FIGS. 1A-1E are cross-sectional views showing the steps of forming a chip package according to an embodiment of the present invention. As shown in FIG. 1A, a substrate 106 is provided, which includes an upper surface 106a and a lower surface 106b. A material of the substrate 106 may include, for example, a semiconductor material, ceramic material, or polymer material. In one embodiment, the substrate 106 is a silicon substrate. In another embodiment, the substrate 106 is a silicon wafer, and it is preferable to simultaneously form a plurality of chip packages by using a wafer-level packaging process along with a dicing process.

As shown in FIG. 1A, the chip package includes a conducting pad 102. For example, the conducting pad 102 may be electrically connected to another conducting wire and/or a chip (not shown). In one embodiment, the conducting pad 102 is located on the lower surface 106b of the substrate 106. In another embodiment, the conducting pad 102 may be located in the substrate 106. In the embodiment shown in FIG. 1A, the conducting pad 102 is located on the dielectric layer 104 on the lower surface 106b of the substrate 106, and a covering layer 100 covers the conducting pad 102 and the dielectric layer 104.

Next, as shown in FIG. 1A, a portion of the substrate 106 is removed to form a hole 108 in the substrate 106. The hole 108 extends from the upper surface 106a towards the lower surface 106b of the substrate 106 and exposes the conducting pad 102. In one embodiment, a width of a lower opening of the hole 108 near the lower surface 106b is larger than a width of an upper opening of the hole 108 near the upper surface 106a, having an "inverted angle" structure. Thus, a sidewall of the hole 108 inclines towards the surface of the substrate 106. For example, in the embodiment shown in FIG. 1A, there is an angle θ between the sidewall of the hole 108 and the lower surface 106b of the substrate 106, wherein the angle θ is larger than 90° and less than 180°.

The forming of the hole 108 includes removing the substrate 106 by a dry etching process. For example, the substrate may be first removed by a main etching process, followed by an over-etching process by changing factors of the etching process. For example, process factors of the etching process, such as power, pressure, and concentration of etching reaction gas, may be tuned to obtain the hole having the "inverted angle" structure.

Next, as shown in FIG. 1A, an insulating layer 110 is formed on the sidewall and a bottom of the hole 108. A material of the insulating layer 110 may be, for example, an epoxy resin, solder mask material, or other suitable insulating material, such as inorganic materials including silicon oxide, silicon nitride, silicon oxynitride, metal oxide, or combinations thereof, or organic polymer materials including polyimide, butylcyclobutene (BCB, Dow Chemical Co.), parylene, polynaphthalenes, fluorocarbons, or acrylates and so on. The method for forming the insulating layer 110 may include a coating method, such as a spin coating, spray coating, or curtain coating method, or other suitable deposition methods, such as a liquid phase deposition, physical vapor deposition, chemical vapor deposition, low pressure chemical vapor deposition, plasma enhanced chemical vapor deposition, rapid thermal chemical vapor deposition, or atmospheric pressure vapor deposition method. In one embodiment, the substrate 106 is a silicon substrate and the insulating layer 110 may be a silicon oxide layer obtained by performing a thermal oxidation process to the silicon substrate. In this embodiment, the insulating layer 110 covers the conducting pad 102 and is further extended overlying the upper surface 106a of the substrate 106.

Figure 1B:
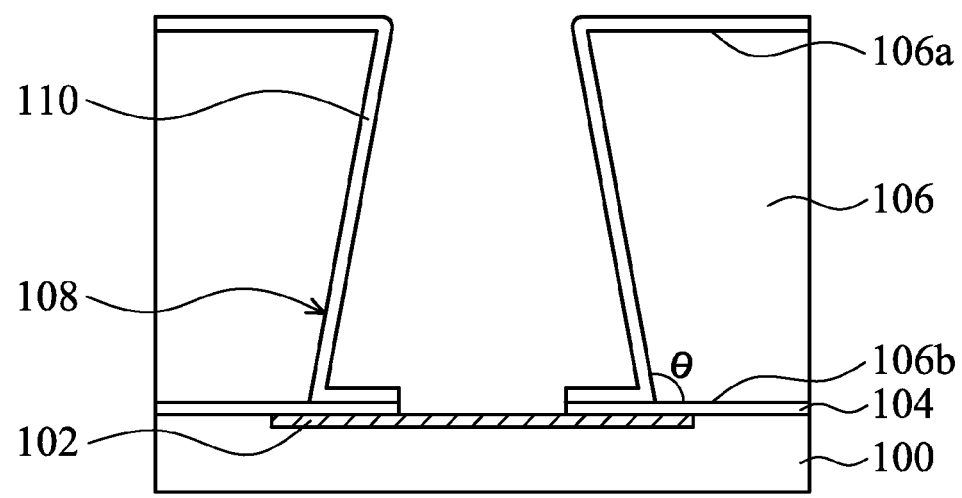

Next, as shown in FIG. 1B, at least portions of the insulating layer 110 and the dielectric layer 104 are removed by, for example, etching to form an opening exposing the a portion of the conducting pad 102. Because the hole 108 has the "inverted angle" structure such that the width of the hole 108 near the upper surface 106a is relatively small, when an etching method is applied to form the opening exposing the conducting pad 102, the etchant may be blocked inherently such that the insulating layer 110 on the sidewall of the hole 108 is not removed because the width of the hole 108 near the upper surface 106a is smaller. Thus, it may not be necessary to additionally form a mask on the insulating layer 110, and the insulating layer 110 may be patterned to form the opening exposing the conducting pad 102. That is, no mask is formed on the hole 108 between the step of forming the insulating layer 110 and the step of at least partially removing the insulating layer 110 between the conducting pad 102 and the bottom of the hole 108. This is because the width of the hole 108 near the upper surface 106a is smaller and may inherently serve as a mask for blocking the etchant. In one embodiment, after the conducting pad 102 is exposed, a thickness of the insulating layer 110 located on the upper surface 106a of the substrate 106 may be reduced as it is not protected.

Figure 1C:
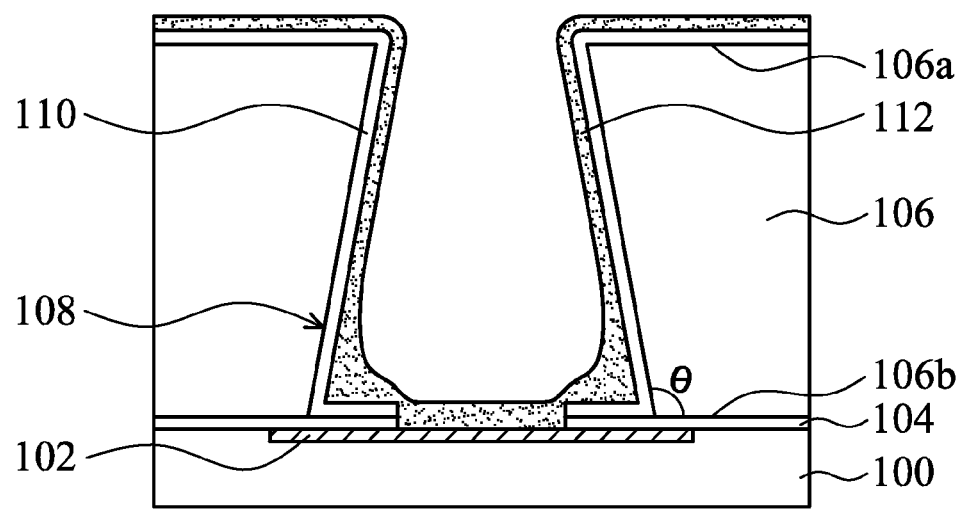

Next, as shown in FIG. 1C, an insulating layer 112 is formed on the substrate 106. The insulating layer 112 further extends overlying the bottom of the hole along the sidewall of the hole 108 and covers the conducting pad 102. A material of the insulating layer 112 includes an insulating material capable of being exposed and developed, such as a photoresist material. The insulating layer 112 may include an epoxy resin, polyimide, or the like. Compared with the insulating layer 110, because the insulating layer 112 needs to be capable of being exposed and developed, the material of the insulating layer 112 is different from the material of the insulating layer 110 in one embodiment.

Figure 1D:
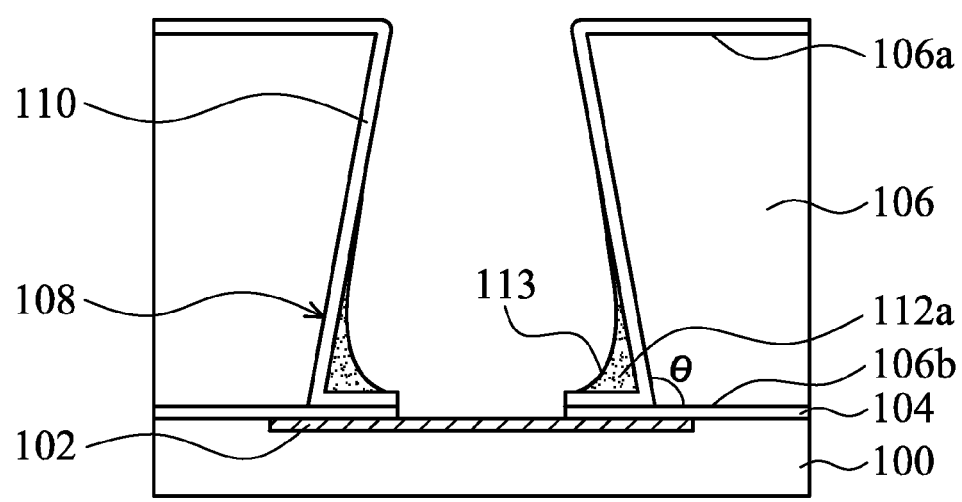

As shown in FIG. 1D, a photolithography process is directly applied to the insulating layer 112 to perform an exposure process and a development process. When the exposure process is performed to the insulating layer 112, a portion of the insulating layer 112 is inherently prevented from being irradiated by light because the width of the hole 108 near the upper surface 106a is smaller. Thus, after the following development process, the portion of the insulating layer 112 that is not irradiated by the light will remain, and a patterned insulating layer 112a may thus be formed. Meanwhile, because a portion of the insulating layer 112 on the conducting pad 102 is exposed by the light during the exposure process, the exposed insulating layer will be removed to expose the conducting layer 102 thereunder after the following development process.

In one embodiment, a thickness of the patterned insulating layer 112a is non-uniform. For example, in the embodiment shown in FIG. 1D, the thickness of a portion of the patterned insulating layer 112a near the lower surface 106b is larger than the thickness of a portion of the patterned insulating layer 112a extending towards the upper surface 106a. As shown in FIG. 1D, the sidewall of the hole 108 near the lower surface 106b and the bottom of the hole 108 form a corner portion (i.e., inverted corner portion of the bottom of the inverted angle structure). The insulating layer 112a covers the corner portion and extends towards the upper surface 106a along the sidewall, and the thickness of the insulating layer 112a decreases along a direction from the corner portion to the upper surface 106a. In other words, the thickness of the insulating layer 112a gradually decreases from its lower portion to its upper portion. In addition, in one embodiment, the insulating layer 112a includes a curved surface 113. When a conducting layer is later formed on the curved surface 113, a profile of the conducting layer may be smoother, preventing the cracking or high stress problems.

Figure 1E:
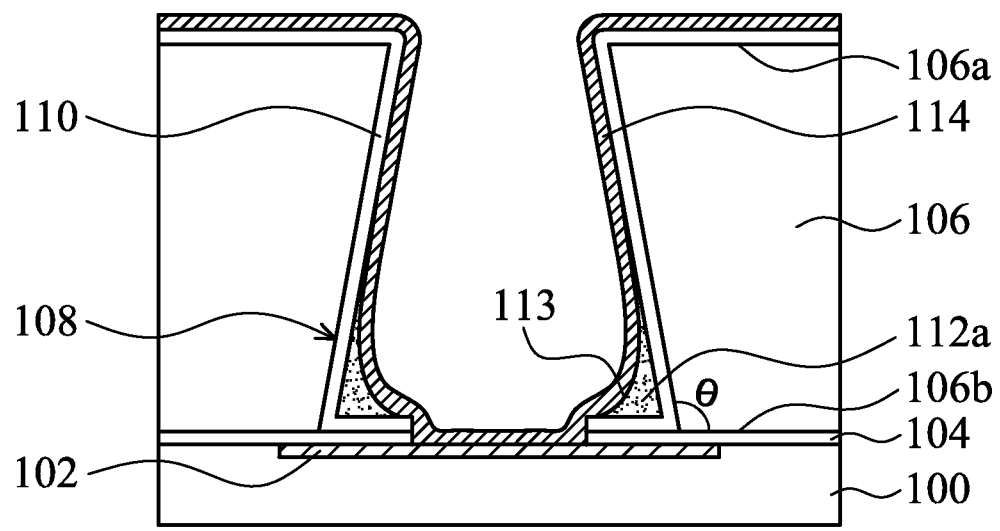

Next, as shown in FIG. 1E, a conducting layer 114 is formed on the sidewall and the bottom of the hole 108. The conducting layer 114 is electrically connected to the conducting pad 102 and covers the insulating layers 110 and 112a. In the embodiment shown in FIG. 1E, the conducting layer 114 is further extended on the upper surface 106a of the substrate 106. A material of the conducting layer 114 may include, for example, copper, aluminum, gold, platinum, or combinations thereof, and the formation method of the conducting layer 114 may be, for example, a physical vapor deposition, chemical vapor deposition, electroplating, or electroless plating method.

In the embodiment shown in FIG. 1E, the insulating layer 112a is located between the conducting layer 114 and the insulating layer 110. In one embodiment, the conducting layer 114 directly contacts with the insulating layer 110 and the insulating layer 112a. For example, in the embodiment shown in FIG. 1E, the conducting layer 114 directly contacts with the insulating layer 110 near the upper surface 106a and directly contacts with the insulating layer 112a near the lower surface 106b. In one embodiment, because of the existence of the insulating layer 112a, the profile of the lower structure of the conducting layer 114 may be modified. Thus, the forming of the conducting layer 114 is smooth, and the cracking or high stress problems may be prevented. In addition, reliability of the chip package is improved due to the material of the insulating layer 112a, including a photoresist material, which helps to release or reduce the stress of the conducting layer 114.

FIGS. 2A-2D are cross-sectional views showing the steps of forming a chip package according to another embodiment of the present invention, wherein same or similar reference numbers are used to designate same or similar elements.

Figure 2A:
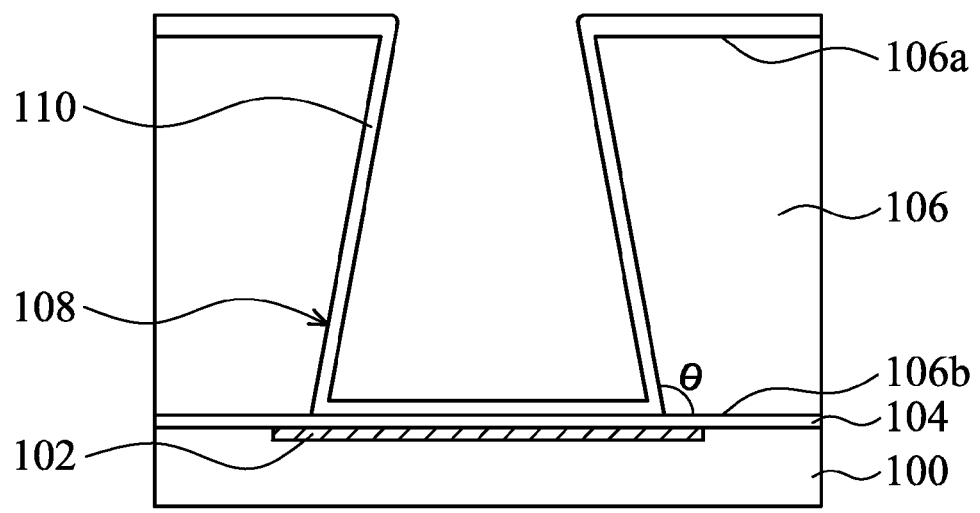
FIGS. 2A-2D are cross-sectional views showing the steps of forming a chip package according to another embodiment of the present invention.
Figure 2B:
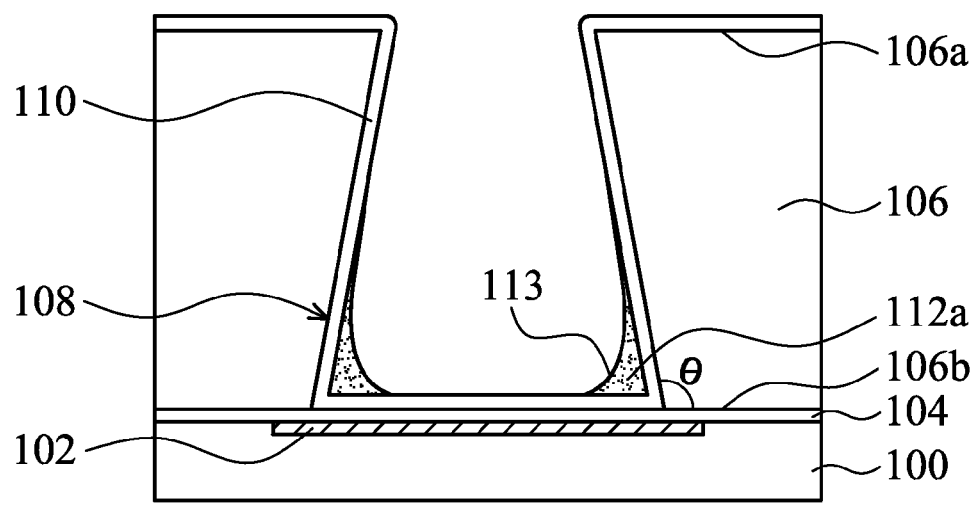

As shown in FIG. 2A, a similar process is performed to provide a structure similar to that shown in FIG. 1A. Then, as shown in FIG. 2B, a patterned insulating layer 112a is formed on the bottom corner of the hole 108. The formation method of the insulating layer 112a may be similar to those shown in FIGS. 1C-1D. For example, a photoresist layer covering the sidewall and the bottom of the hole 108 may first be formed, and a exposure process and a development process are directly performed to the photoresist layer to form the patterned insulating layer 112a. It should be appreciated that a portion of light may be inherently blocked because the width of the hole 108 near the upper surface 106a is smaller. Thus, in a situation where no additional mask needs to be used, the insulating layer 112a having the profile shown in FIG. 2B may be formed. That is, no mask is formed on the hole 108 between the step of forming the insulating layer 112 and the step of forming the insulating layer 112a. This is because the width of the hole 108 near the upper surface 106a is smaller and may inherently serve as a mask for blocking the etchant.

Figure 2C:
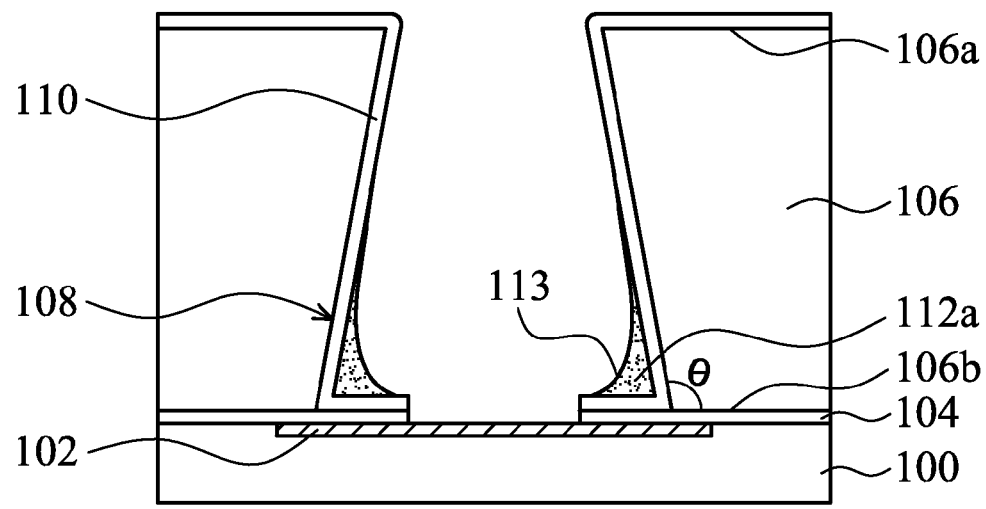
Figure 2D:
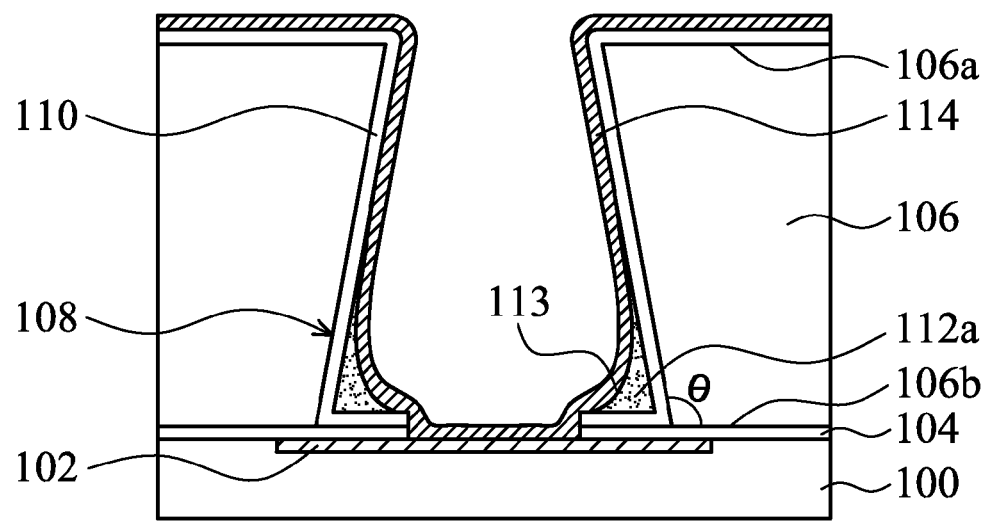

Next, as shown in FIG. 2C, portions of the insulating layer 110 and the dielectric layer 104 are removed to expose the conducting pad 102. Similarly, because the upper width of the hole 108 is smaller, the opening exposing the conducting pad 102 may be formed in a situation where no mask needs to be used. Fabrication cost and time may be reduced. Then, as shown in FIG. 2D, a conducting layer 114 may be formed in the hole 108 by a method similar to that shown in FIG. 1E to accomplish the fabrication of a chip package according to an embodiment of the invention.

Figure 3A:
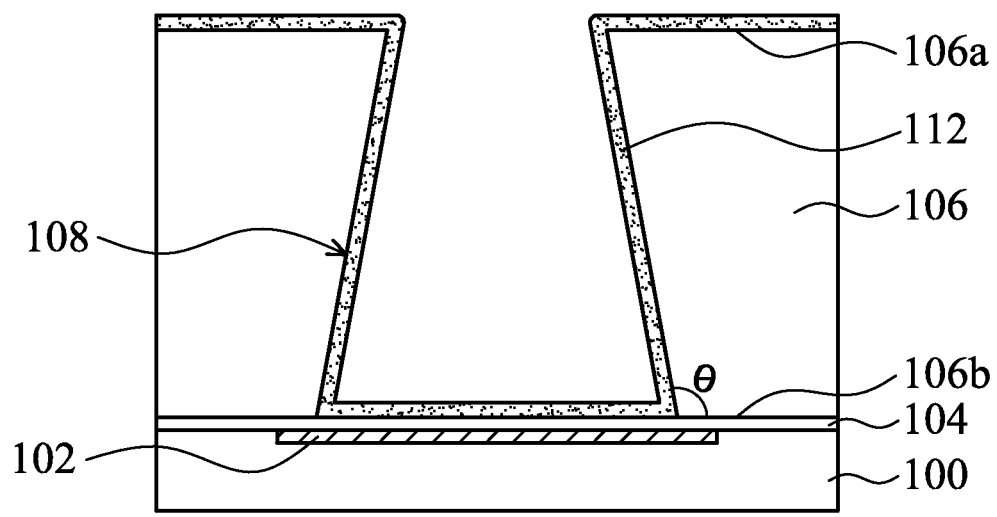
FIGS. 3A-3C are cross-sectional views showing the steps of forming a chip package according to yet another embodiment of the present invention.
Figure 3B:
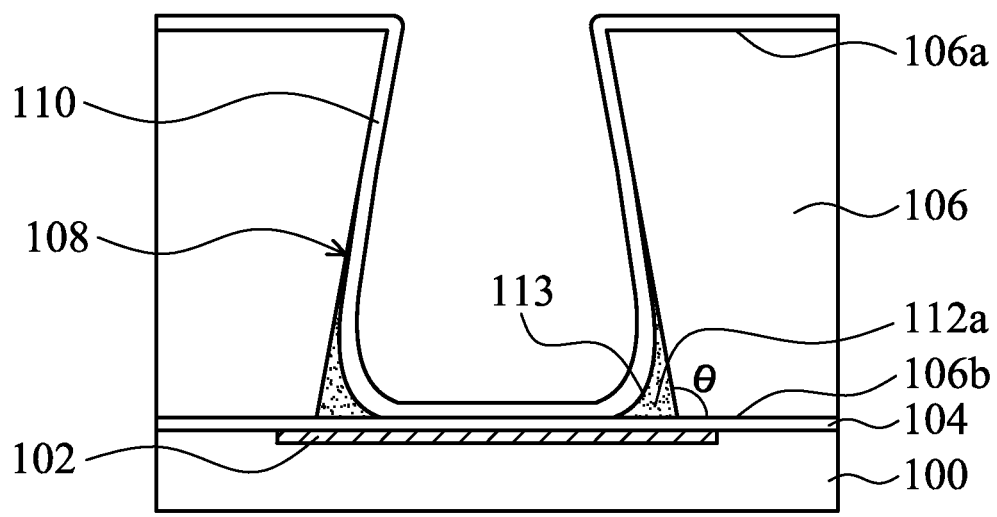
Figure 3C:
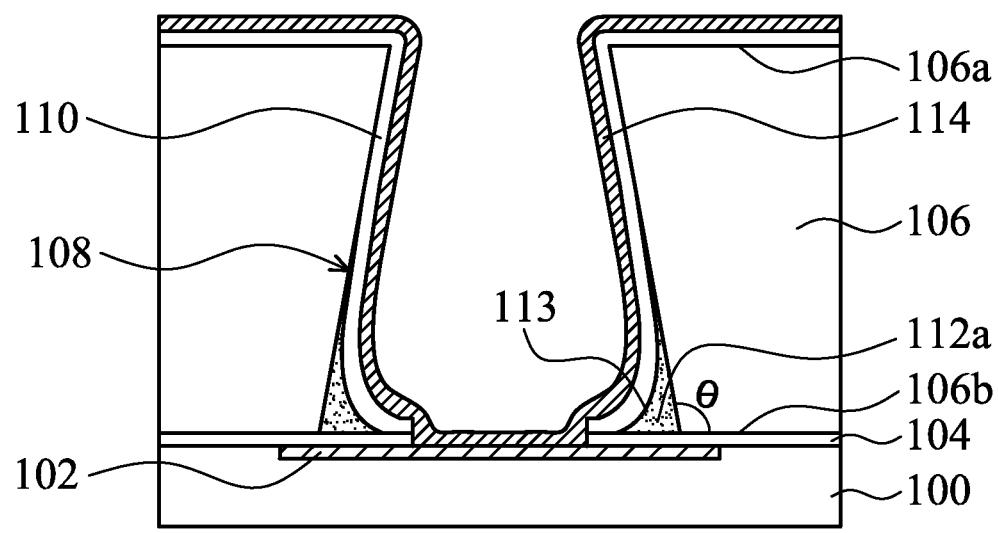

FIGS. 3A-3C are cross-sectional views showing the steps of forming a chip package according to yet another embodiment of the present invention, wherein same or similar reference numbers are used to designate same or similar elements. Compared with the embodiments shown in FIGS. 1 and 2, the insulating layer 112 in the embodiment shown in FIG. 3 is formed earlier than formation of the insulating layer 110.

As shown in FIG. 3A, a hole 108 having an "inverted angle" structure may be formed in the substrate by a similar method, wherein the hole 108 corresponds to a conducting pad 102 thereunder. Then, an insulating layer 112 capable of being exposed and developed is formed on a sidewall and a bottom of the hole 108.

Next, as shown in FIG. 3B, an exposure process and a development process are directly performed to the insulating layer 112 to form a patterned insulating layer 112a. It should be appreciated that because a width of the hole 108 near the upper surface 106a is smaller, a portion of light may be inherently blocked. Thus, in a situation where no additional mask needs to be used, the insulating layer 112a having the profile shown in FIG. 3B may be formed.

Then, an insulating layer 110 is formed on the sidewall and the bottom of the hole 108. The insulating layer 110 covers the insulating layer 112a and may extend on the upper surface 106a of the substrate 106. Because the insulating layer 110 is conformally formed on the insulating layer 112a, a profile of the insulating layer 110 may also help the following formation of a conducting layer.

As shown in FIG. 3C, portions of the insulating layer 110 and the dielectric layer 104 are removed to expose the conducting pad 102. Similarly, because the upper width of the hole 108 is smaller, the opening exposing the conducting pad 102 may be formed in a situation where no mask needs to be used. Fabrication cost and time may be reduced. Then, a conducting layer 114 is formed in the hole 108 to accomplish the fabrication of a chip package according to an embodiment. In the embodiment shown in FIG. 3C, the insulating layer 110 is located between the conducting layer 114 and the insulating layer 112a. Thus, in this embodiment, the conducting layer 114 does not directly contact with the insulating layer 112a under the insulating layer 110.

Because a hole having an "inverted angle" structure is adopted in a chip package of an embodiment of the invention, many patterning process steps may thus be reduced. For example, both the forming of the opening exposing the conducting pad and the forming of the patterned insulating layer 112a do not need to additionally use a mask. In addition, in the embodiments of the present invention, multiple insulating layers, such as the insulating layers 110 and 112a, are formed on the sidewall of the hole such that the profile between the sidewall of the hole and the bottom corner may be modified. The conducting layer is therefore formed on the insulating layer having a smoother profile. The cracking or too much stress problems of the conducting layer may be prevented, improving reliability of the chip package.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
a substrate having an upper surface and a lower surface, wherein the substrate comprises a semiconductor material;
a conducting pad located on the lower surface of the substrate;
a hole extending from the upper surface towards the lower surface of the substrate;
an insulating layer located on a sidewall of the hole, wherein the insulating layer extends from the sidewall of the hole onto the upper surface of the substrate and is in direct contact with the semiconductor material;
a material layer located on the insulating layer on the sidewall of the hole, wherein the material layer is separated from the upper surface of the substrate by a distance, wherein the material layer is completely located in the hole without extending to the upper surface of the substrate; and
a conducting layer conformally formed on the sidewall of the hole and extending onto the upper surface, wherein the conducting layer does not completely fill the hole and does not completely fill an entrance to the hole.

2. The chip package as claimed in claim 1, wherein the material layer comprises an insulating layer, a photoresist layer, a diffusion barrier layer, a seed layer, a conducting layer, a buffer layer, or combinations thereof.

3. The chip package as claimed in claim 1, wherein a width of a lower opening of the hole near the lower surface is not equal to a width of an upper opening of the hole near the upper surface.

4. The chip package as claimed in claim 1, wherein an angle between the sidewall of the hole and the upper surface of the substrate is larger than 90° and less than 92°.

5. The chip package as claimed in claim 1, further comprising a second material layer located on the material layer, wherein the second material layer is separated from the upper surface of the substrate by a distance.

6. The chip package as claimed in claim 5, wherein a thickness of the second material layer decreases along a direction towards the lower surface.

7. The chip package as claimed in claim 5, wherein the conducting layer is located between the material layer and the second material layer.

8. The chip package as claimed in claim 1, wherein the conducting layer is located on the insulating layer.

9. The chip package as claimed in claim 8, wherein the material layer is located between the conducting layer and the insulating layer.

10. The chip package as claimed in claim 8, wherein the conducting layer is located between the material layer and the insulating layer.

11. The chip package as claimed in claim 1, wherein the sidewall of the hole near the lower surface and a bottom of the hole form a corner portion, and the material layer covers the corner portion.

12. The chip package as claimed in claim 1, wherein the material layer comprises a curved surface.

13. The chip package as claimed in claim 1, further comprising a dielectric layer located on the lower surface of the substrate and between the semiconductor material and the conducting pad.

14. A method for forming a chip package, comprising:
providing a substrate having an upper surface and a lower surface, and a hole extending from the upper surface towards the lower surface of the substrate, wherein the substrate comprises a semiconductor material;
providing a conducting pad located on the lower surface of the substrate;
forming an insulating layer on a sidewall of the hole, wherein the insulating layer extends from the sidewall of the hole onto the upper surface of the substrate and is in direct contact with the semiconductor material;
forming a material layer on the insulating layer on the sidewall of the hole, wherein the material layer is separated from the upper surface of the substrate by a distance, and wherein the material layer is completely located in the hole without extending to the upper surface of the substrate; and forming a conducting layer conformally on the sidewall of the hole and extending onto the upper surface, wherein the conducting layer does not completely fill the hole and does not completely fill an entrance to the hole.

15. The method for forming a chip package as claimed in claim 14, further comprising:

disposing a temporary blocking layer on the upper surface of the substrate before the material layer is formed, wherein the temporary blocking layer has an opening exposing the hole; and removing the temporary blocking layer after the material layer is formed.

16. The method for forming a chip package as claimed in claim 15, further comprising forming a second material layer on the sidewall of the hole, wherein the second material layer is separated from the upper surface of the substrate by a distance, and a thickness of the second material layer decreases along a direction towards the lower surface.

17. The method for forming a chip package as claimed in claim 15, wherein the conducting layer is located on the insulating layer.

18. The method for forming a chip package as claimed in claim 17, wherein the conducting layer is located between the material layer and the insulating layer.

19. The method for forming a chip package as claimed in claim 17, wherein the material layer is located between the conducting layer and the insulating layer.

20. The method for forming a chip package as claimed in claim 14, wherein a width of a lower opening of the hole near the lower surface is not equal to a width of an upper opening of the hole near the upper surface, and the step of forming the material layer comprises:

forming an original material layer on a sidewall and a bottom of the hole; and performing an exposure process and a development process to the original material layer to pattern the original material layer into the material layer.

21. The method for forming a chip package as claimed in claim 20, wherein no mask is formed on the hole between the step of forming the original material layer and the step of forming the material layer.

* * * * *